(12) United States Patent
Harmand et al.

(10) Patent No.: US 11,239,049 B2
(45) Date of Patent: Feb. 1, 2022

(54) TRANSMISSION ELECTRON MICROSCOPE PROVIDED WITH AT LEAST ONE BALLISTIC MATERIAL JET SOURCE

(71) Applicant: CENTRE NATIONAL DE LA RECHERCHE SCIENTIFIQUE, Paris (FR)

(72) Inventors: Jean-Christophe Harmand, Saint Michel sur Orge (FR); Laurent Travers, Meudon la Foret (FR); Yannick Ollivier, Les Ulis (FR)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 17/049,866

(22) PCT Filed: Apr. 30, 2019

(86) PCT No.: PCT/EP2019/061115
§ 371 (c)(1),
(2) Date: Oct. 22, 2020

(87) PCT Pub. No.: WO2019/211305
PCT Pub. Date: Nov. 7, 2019

(65) Prior Publication Data
US 2021/0241994 A1    Aug. 5, 2021

(30) Foreign Application Priority Data
May 2, 2018    (FR) ........................ 1853774

(51) Int. Cl.
*H01J 37/26*    (2006.01)

(52) U.S. Cl.
CPC ....... *H01J 37/26* (2013.01); *H01J 2237/2002* (2013.01)

(58) Field of Classification Search
CPC .................. H01J 37/26; H01J 2237/2002
See application file for complete search history.

(56) References Cited

U.S. PATENT DOCUMENTS

| 4,878,989 | A | 11/1989 | Purdes |
| 5,431,735 | A | 7/1995 | Briones |

FOREIGN PATENT DOCUMENTS

| EP | 1821146 A1 | 8/2007 |
| JP | S63297294 A | 12/1988 |
| JP | 2004119291 A | 4/2004 |

OTHER PUBLICATIONS

French Search Report from French Patent Application No. 1853774, dated Feb. 19, 2019.
International Search Report and Written Opinion for International Patent Application No. PCT/EP2019/061115, dated Jul. 30, 2019.

*Primary Examiner* — Nicole M Ippolito
*Assistant Examiner* — Hanway Chang
(74) *Attorney, Agent, or Firm* — Greer, Burns & Crain Ltd.

(57) ABSTRACT

A transmission electron microscope is provided, including a column defining an object chamber, at least one ballistic material jet source outside the object chamber, and tightly attached to the column, facing an opening, referred to as a port, provided on the column; having at least one jet source arranged outside the column and including a collimator of the material jet towards a predetermined direction, passing through the port and leading into the object chamber so that a portion of the material jet exits the source in the object chamber.

14 Claims, 3 Drawing Sheets

TRANSMISSION ELECTRON MICROSCOPE PROVIDED WITH AT LEAST ONE BALLISTIC MATERIAL JET SOURCE

BACKGROUND

The present invention relates to a transmission electron microscope provided with at least one ballistic material jet source, such as for example a ballistic molecule jet source, or a ballistic radical jet source.

The field of the invention is the field of transmission electron microscopy.

Molecular beam epitaxy consists of sending one or more molecular beams towards a substrate, for the purpose of producing a crystalline growth on said substrate, in particular in the form of a layer of nanometric thickness.

Transmission electron microscopy is a well-known imaging technique, which uses the interaction of a beam of electrons emitted towards a very thin sample to be imaged. The electrons passing through the sample are used to produce an image of said sample, with a resolution that can reach several hundredths of a nanometre.

As a result, a transmission electron microscope (TEM) proposes an imaging precision that is particularly well suited to observing and monitoring a crystalline growth operation using a ballistic material jet. However, no TEM exists which makes it possible to produce growth using a ballistic material jet and to observe said growth, with an effective and user-friendly architecture.

An aim of the present invention is to overcome the aforementioned drawbacks.

Another aim of the present invention is to propose a transmission electron microscope making it possible to produce growth using a ballistic material jet having an architecture that is effective, simple and highly flexible.

Another aim of the present invention is to propose a transmission electron microscope which makes it possible to produce growth using a ballistic material jet and is user-friendly.

SUMMARY

At least one of these aims is achieved with a transmission electron microscope (TEM) comprising a column delimiting an object chamber, characterized in that it also comprises at least one ballistic material jet source:
- outside said object chamber, and
- fixed in a sealed manner to said column, facing an opening, called port, provided on said column.

By "ballistic material jet" is preferably meant a material jet which projects particles of material (each particle preferably having a mass less than 500 atomic mass units and/or less than $10^{-24}$ kg) in the manner of a projectile, preferably without interference, on the trajectories of these particles, by a gas or by other mobile particles (preferably at least until the object chamber and/or inside the object chamber). Thus, a "ballistic material jet" is preferably constituted by particles (each particle preferably having a mass less than 500 atomic mass units and/or less than $10^{-24}$ kg) which do not undergo deviation of their trajectory caused by collisions with other mobile particles (preferably at least until the object chamber and/or inside the object chamber). Thus, a "ballistic material jet" is preferably constituted by particles having rectilinear trajectories (preferably at least until the object chamber and/or inside the object chamber).

Thus, the invention proposes a TEM equipped with an external ballistic material jet source, mounted on the column of said TEM in a sealed manner and facing a port provided on the column and making it possible to send a ballistic material jet into the object chamber.

The architecture proposed herein is effective and non-complex because it avoids placing the ballistic source in the limited space of the object chamber.

In addition, the microscope according to the invention is flexible and simple to use because, as the ballistic source is outside the object chamber, there are fewer constraints/limitations on the nature and dimensions of said source.

Moreover, the microscope according to the invention is user-friendly and easy to maintain, because it is possible to work on the ballistic source without accessing the object chamber, and without working on any other component of the microscope.

According to a non-limitative embodiment, the microscope according to the invention can comprise several ballistic material jet sources fixed to the column.

Thus, it is possible to produce ballistic material jets in at least two different directions, simultaneously or not.

At least two sources can be fixed to the column of the microscope, each facing an individual port. Alternatively, at least two sources can be fixed to the column facing a common port.

At least one source can be arranged to emit a ballistic material jet in a direction that rises with respect to the horizontal direction. Thus, it is possible to utilize a liquid material load in said source.

Preferably, at least one jet source is arranged outside the column and comprises a collimator of the material jet towards a predetermined direction, passing through the port and leading into the object chamber so that the material jet (or at least a portion of the material jet) exits said source in said object chamber.

More precisely, at least one jet source is preferably arranged outside the column and comprises a material jet collimator which selects the particles of the material jet the rectilinear trajectory of which is directed in a predetermined direction, passing through the port and leading into the object chamber so that only the portion of the material jet exiting said source in the exact direction of the sample enters into said object chamber.

Advantageously, at least one source can comprise any combination of one or more material jet generators selected from:
- an effusion cell,
- a plasma source,
- a radical generator using thermal cracking,
- an electron bombardment evaporator.

In particular, at least one source can comprise at least two jet generators using different source materials. Thus, it is possible to produce jets of different materials, simultaneously or not.

Alternatively, or in addition, at least one source can comprise at least two jet generators using identical source materials. Thus, it is possible to increase the quantity of material jets.

According to an advantageous characteristic, at least one source can comprise at least one material jet generator that can be removed through an access opening provided on said source.

It is thus possible to replace the generator simply and quickly.

In addition, after having removed the generator, it is possible to use the access opening to check and adjust the orientation of the source, or to observe the alignment of the source with a substrate positioned in the object chamber, or with the sample holder of the microscope.

According to a particular embodiment example, the generator can be integral with a mounting flange closing the access opening. Thus, manipulating the generator with the aim of positioning and replacing it is further simplified.

Preferably, at least one source can comprise at least one collimator of the material jet towards a predetermined direction.

Such a collimator makes it possible to obtain a directional jet that is very precise, and to retain/trap the particles of materials which are not able to reach the target substrate due to their directions.

The collimator is preferably arranged to trap particles from the material jet which are not emitted in the predetermined direction and to prevent these particles that were not emitted in the predetermined direction from passing into the object chamber.

According to a non-limitative embodiment example, such a collimator can have a material jet output opening, the cross section of which is comprised between 0.5 mm$^2$ and 1.5 mm$^2$, and in particular 1 mm$^2$.

Advantageously, the collimator can be made from a porous material, such as for example $TiO_2$. Such a material has a larger capacity for trapping non-collimated materials, and therefore offers a better protection of the microscope.

When a source comprises several generators, said source can comprise a collimator common to at least two generators.

Alternatively or in addition, at least two generators can each be associated with an individual collimator.

Advantageously, the microscope according to the invention can comprise means for maintaining the collimator at a temperature that is low enough that the particles from the material jet emitted upstream and in the direction of the walls of the collimator are trapped there, this low enough temperature preferably being lower than 25° C.

Advantageously, at least one collimator can have a cross section which decreases in the direction of the material jet. Thus, the collimator can receive and trap a larger quantity of non-collimated materials at the input, while preventing it from being rapidly obstructed by the trapped material.

According to an embodiment, the cross section of the collimator can decrease continuously. For example, the collimator can have a conical shape with a circular, triangular etc. cross section.

According to an embodiment, the cross section of the collimator can decrease discontinuously or discretely. For example, the collimator can have several tubes, the cross sections of which are ever smaller.

At least one source in the microscope according to the invention can advantageously comprise at least one shutter for interrupting the material jet towards the object chamber.

Such a shutter makes it possible to start, stop or recommence the emission of the material jet quickly and responsively.

Such a shutter can be arranged after the output of the material generator, or before the input of the collimator in the direction of propagation of the jet.

Such a shutter can be in the form of a mask or a partition.

Such a shutter can also be a needle valve sealing the output of the generator or the input of the collimator.

Such a shutter can be brought into a sealing position or displaced by a rotational movement, optionally associated with a prior or subsequent translation movement, in particular manually.

Such a shutter can be actuated by means of an axle that can be manipulated from outside the source.

According to the invention, at least one source can comprise at least one heat shield arranged around a material jet generator.

In particular, at least one source can comprise several, in particular concentric, heat shields arranged around a material jet generator.

At least one heat shield can be made from metal.

When the source comprises a material jet collimator, at least a portion of the latter can produce a heat shield.

Advantageously, at least one source can comprise at least one pump opening for connection thereto of a pump device adjusting, and in particular lowering, the pressure inside said source.

Such a pump opening can be equipped with a connector or a joint to produce the connection to the pump device.

The source can be connected to the pump device using a flexible metal tube.

The pump device can be provided to obtain a residual pressure lower than $10^{-4}$ Torr during the operation of the generator. The pump device also makes it possible to impart the ballistic character of the material jet.

According to a particularly advantageous characteristic, the microscope according to the invention can comprise, for at least one source, an adjustment means, called aiming adjustment means, for adjusting the direction of the material jet, in at least one spatial direction, in particular in the three spatial directions.

The aiming adjustment means can allow adjustment in several directions, and in particular individually for each direction.

For at least one source, the aiming adjustment means can comprise:
  a bellows arranged between said source and the column of the microscope; and
  at least one means for modifying the compression of said bellows following at least one point.

The modification means can comprise a screw making it possible to compress or relax the bellows at a point on its periphery.

Advantageously, the adjustment means can comprise three screws distributed in an equiangular or equidistant manner.

For at least one source, the aiming adjustment means can comprise at least one means for modifying the position of a material jet collimator within said source.

According to an embodiment example, the aiming adjustment means can comprise a means for modifying only the position of the collimator. Such an adjustment means can comprise:
  a bellows to which said collimator is fixed and allowing the displacement of said collimator; and
  one or more adjustment screws modifying the position of the collimator.

The microscope according to the invention can comprise at least one jet source arranged outside the column and comprising a part, in particular a collimator, passing through the port and leading into the object chamber such that the material jet exits said source in said object chamber.

In this case, the distal part of the source passes through the wall of the column of the microscope and enters into the object chamber.

Alternatively or in addition, at least one jet source can be arranged outside the column, such that the material jet exits said source before the port, or before the object chamber.

In this case, the source does not enter into the port, respectively into the object chamber.

Advantageously, for at least one source, the inside of said source communicates with the object chamber only though a material jet collimator.

As this jet collimator has an output opening with a very small cross section, the conductance between the object chamber and the source is necessarily very low. It is then possible to maintain a differential of at least three decades between the source and the object chamber. Advantageously, the low conductance makes it possible to operate any source without significantly affecting the residual pressure in the object chamber.

It is possible for example to maintain a pressure of the order of $10^{-7}$ Torr in the object chamber while having a pressure of the order of $10^{-4}$ Torr in the source.

According to a non-limitative embodiment example of the microscope according to the invention, at least one source can comprise:
- a ballistic material jet generator, such as an effusion cell in which the source material is heated by a resistive filament or by an electron bombardment,
- two concentric heat shields around said generator,
- a material jet collimator downstream of said generator,
- a shutter between said generator and said collimator,
- a means for adjusting the aiming direction.

BRIEF DESCRIPTION OF THE DRAWINGS

Other advantages and characteristics will become apparent on examination of the detailed description of examples that are in no way limitative, and from the attached drawings, in which.

DETAILED DESCRIPTION

It is well understood that the embodiments that will be described hereinafter are in no way limitative. Variants of the invention can in particular be imagined comprising only a selection of characteristics described hereinafter in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described can be combined together if there is no objection to this combination from a technical point of view.

In the figures, the elements common to several figures keep the same reference.

Figure 1:
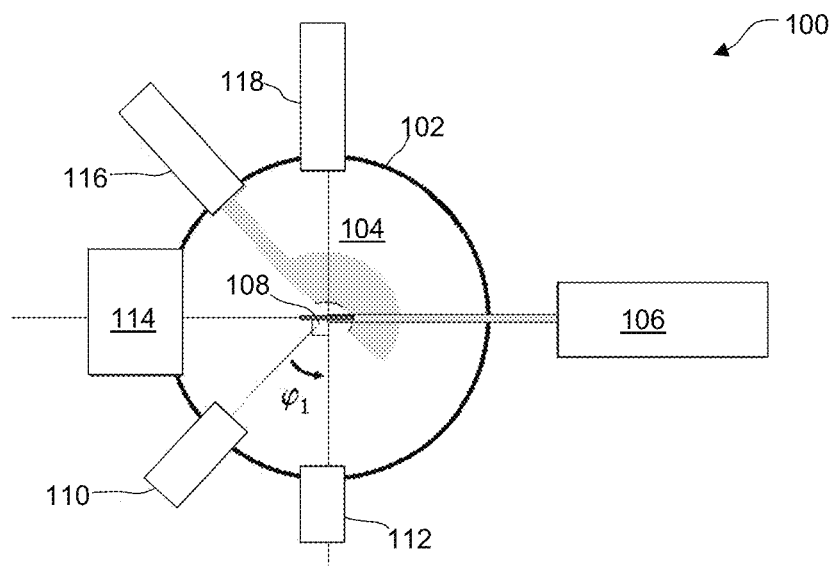
FIG. 1 is a partial diagrammatic representation, in a cross-section view from above, of a first embodiment example of a microscope according to the invention.

FIG. 1 is a diagrammatic representation, in a cross-section view from above, of a first non-limitative embodiment example of a transmission electron microscope (TEM) according to the invention.

The microscope 100, shown in FIG. 1, comprises a column 102 delimiting a vacuum chamber 104, also called object chamber, comprising polar parts (not shown in FIG. 1) of the TEM.

The microscope 100 also comprises a sample holder 106 descending into the vacuum chamber 104. In the vacuum chamber 104, the sample holder 106 forms a support for a sample, and in particular a substrate 108.

The microscope 100 according to the invention comprises a ballistic material jet source 110, directed towards the substrate 108. The source 110 emits a ballistic material jet onto the substrate 108 to produce a crystal growth on said substrate 108.

The ballistic material jet source 110 is mounted on the wall of the column 102 of the microscope 100 and is located, at least partially, outside the vacuum chamber 104.

Moreover, the TEM according to the invention 100 can comprise, in a known manner, an x-ray detector 112, a vacuum pump 114, a vapour condensation device 116 (called "cold trap") as well as other standard components in a TEM such as diaphragms 118.

The ballistic material jet source 110 is oriented in a direction forming an angle $\varphi_1$ with respect to the direction of the detector 114. Preferably, this angle $\varphi_1$ is less than or equal to 45°.

Figure 2:
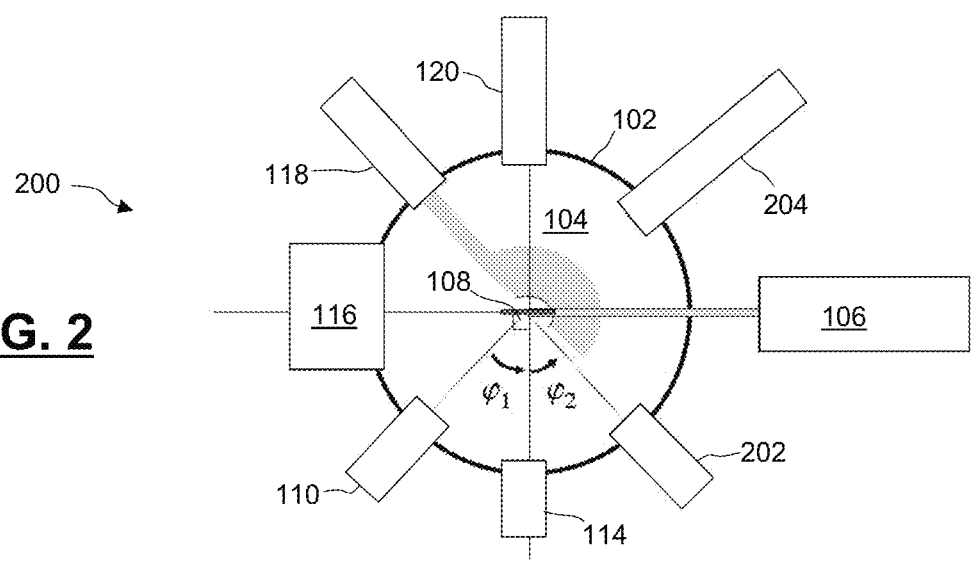
FIG. 2 is a partial diagrammatic representation, in a cross-section view from above, of another embodiment example of a microscope according to the invention.

FIG. 2 is a diagrammatic representation, in a cross-section view from above, of a second non-limitative embodiment example of a transmission electron microscope (TEM) according to the invention.

The microscope 200, shown in FIG. 2, comprises all the components of the microscope 100 in FIG. 1.

The microscope 200 also comprises a second ballistic material jet source 202, directed towards the substrate 108. The source 202 emits a ballistic material jet onto the substrate 108 to produce a crystal growth on said substrate 108, simultaneously with the source 110 or in turn.

The ballistic material jet source 202 is mounted on the wall of the column 102 of the microscope 100 and is located, at least partially, outside the vacuum chamber 104.

The ballistic material jet source 202 is oriented in a direction forming an angle $\varphi_2$ with respect to the direction of the detector 114. Preferably, this angle $\varphi_2$ is less than or equal to 45°.

Preferably, the sources 110 and 202 are arranged on either side of the direction of the detector 114, as shown in FIG. 2.

The microscope 200 can also comprise a plasma source 204 directed towards the substrate 108. The plasma source 112 is mounted on the wall of the column 102 of the microscope 100 and is located, at least partially, outside the vacuum chamber 104.

Generally, the microscope according to the invention can comprise one or more ballistic material jet sources and is not limited to one or two sources.

Figure 3:
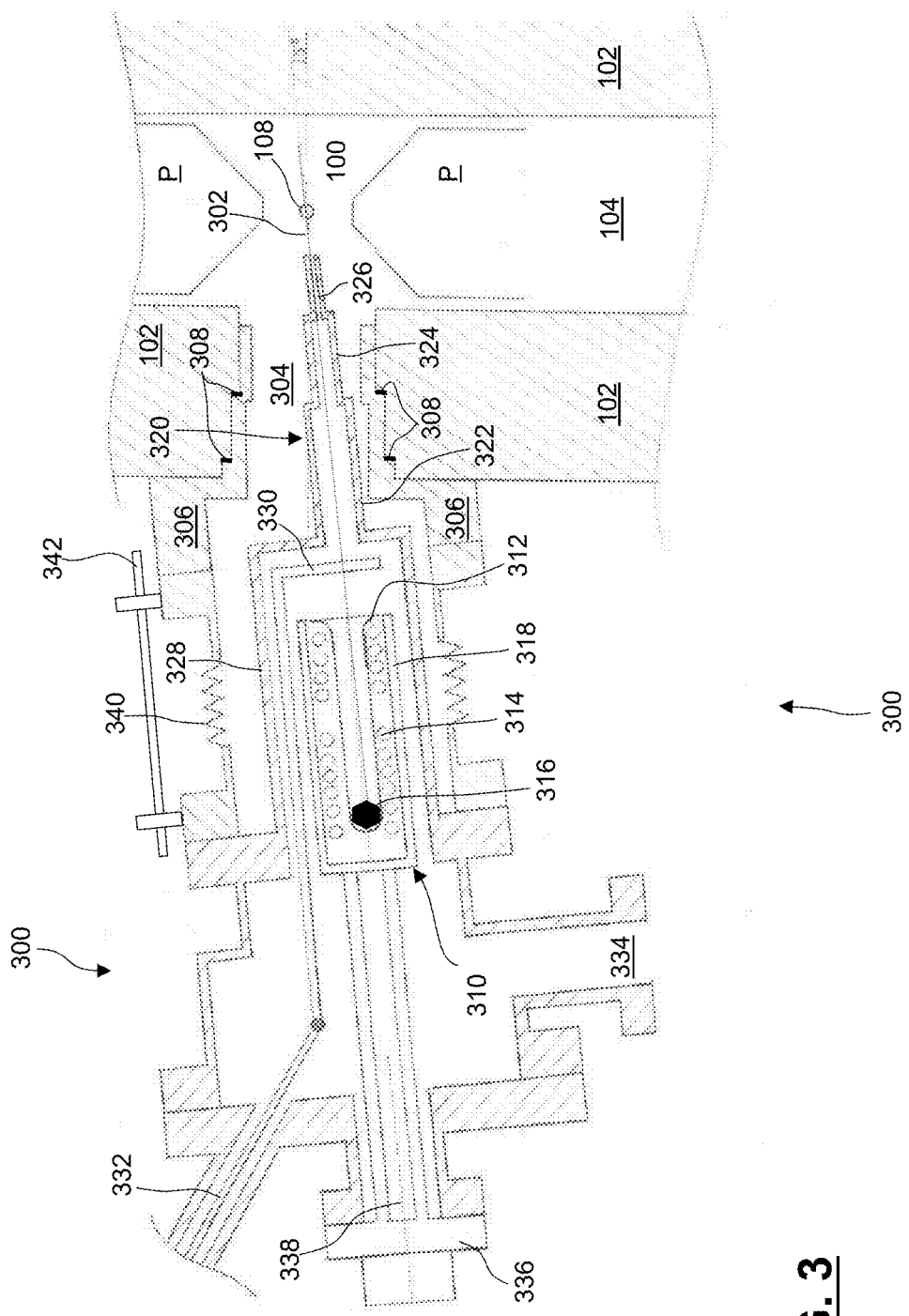
FIG. 3 is a partial diagrammatic representation, in a cross-section view, of a first embodiment example of a ballistic material jet source that can be utilized in a microscope according to the invention.

FIG. 3 is a partial diagrammatic representation, in a cross-section view, of a first non-limitative embodiment example of a ballistic material jet source that can be utilized in a microscope according to the invention.

The source 300 can be any one of the sources 110, 202 and 204 in FIGS. 1 and 2.

The source 300 in FIG. 3 is shown mounted on the column of the microscope, which can be the microscope 100 or 200 in FIGS. 1 and 2, where the polar parts referenced P are visible.

The ballistic material jet source 300 is oriented in a direction 302. The source 300 is integral with the column 102 of the microscope, facing an opening 304 called port, provided on the column 102 of the microscope.

As shown in FIG. 3, the source 300 is located outside the column 102 of the microscope and is integral with the wall of the column 102 on the outside.

In particular, an optional intermediate part 306 is inserted into the port 304, in a sealed manner, for example using joints 308 made from elastomers or copper, in particular at the steps of said intermediate part 306. Assembly of the intermediate part 306 in the port 304 can be carried out by any known means, for example by screwing. The intermediate part 306 is fixed to the column 102 in a rigid and integral manner.

The source 300 comprises a material jet generator, and in particular an effusion cell 310.

The cell 310 comprises a crucible 312 comprising a live resistive double electric filament 314 to heat a material load 316 placed in said crucible 312. The molecules generated in the crucible exit said effusion cell 310 through an opening provided on the side of the microscope.

The effusion cell 310 comprises a first heat shield 318, for example made from refractory metal, to thermally insulate said effusion cell 310, and in particular the crucible 312.

The source 300 also comprises, downstream of the effusion cell 310, a material jet collimator 320.

The collimator 320 comprises three areas having different cross sections: an input area 322 located on the effusion cell 310 side, an intermediate area 324 and an output area 326 located on the sample 108 side. The material jet enters the collimator 320 via the input area 322 and exits the collimator 320 via the output area 326. The cross sections of the areas 322-326 decreases in such a way that the cross section of the input area 322 is larger than that of the intermediate area 324, itself larger than that of the output area 326.

The architecture of the collimator 320, in several areas 322-326 having different cross sections, makes it possible to trap a large number of molecules or particles which are not emitted in the target direction 302 and prevents these molecules or particles that are not necessary for the experiment from passing into the object chamber 104 and contaminating the microscope.

The cross section of the output area 326 is of the order of 1 mm². It is also the cross section of the material jet exiting the collimator 320, and thus the source 300.

In the vicinity of the input area 322, the collimator 320 is extended around the effusion cell 310 by a second heat shield 328, for example made from metal. The second heat shield 328 surrounds and encompasses the first heat shield 318, itself encompassing the crucible 312. The combination of the first and second heat shields 318 and 328 makes it possible to protect the seals and to obtain thermal insulation such that the temperature of the column 102 of the microscope is less than or equal to 60° C. while the temperature in the effusion cell 310 can be of the order of 1000° C.

The source 300 also comprises a jet shutter, having the form of a mask 330 positioned between the output of the effusion cell 310 and the input of the collimator 320.

The shutter 330 makes it possible to cut the jet of molecules towards the substrate 108 quickly and responsively. The position of the shutter 330 can be modified by rotation, by means of a control axle 332.

The source 300 also comprises a pump opening 334 making it possible to connect a turbomolecular pump to it, for example using a pump flange combined with a flexible metal tube (not shown). Thus, it is possible to create, by pumping, a vacuum in the source 300, for example of the order of $10^{-8}$ Torr, without putting the source into operation.

It should be noted that the inside of the source 300 is in communication with the object chamber only through the collimator 320, and in particular through the output area 326 of the collimator 320, this output area 326 having a very small cross section, for example of the order of 1 mm². Thus it is possible to create a pressure differential between the source and the object chamber 104 of the order of at least three decades: for example it is possible to maintain a pressure of $10^{-7}$ Torr in the object chamber 104 with a pressure of $10^{-4}$ Torr in the source 300 in operation.

Moreover, the cell 310 is integrally connected, for example by means of at least one rod, to a mounting flange 336 closing an access opening 338. Thus, it is possible to remove the effusion cell 310 through the access opening 338, to replace it or repair it.

Moreover, after having removed the effusion cell 310, it is possible to use the access opening 338 to check and adjust the orientation of the source 300 and in particular the axis of its collimator 302, with respect to the sample holder. The molecular jet source 300 is thus aligned with the substrate 108 fixed on the sample carrier of the microscope 100.

In addition, the microscope also comprises a bellows 340, arranged between, on the one hand, the source 300 and, on the other hand, the column 102 of the microscope, and more precisely the intermediate part 306.

The bellows 340 is fixed in a rigid and sealed manner to the source 300 on one side and to the intermediate part 306 on the other side. The bellows 340 can be fixed to the source 300, respectively to the intermediate part 306, by screwing and by using a copper seal mounted on a stainless steel flange.

The microscope can comprise three threaded rods 342, positioned at three equiangular positions around the bellows 340. Each rod 340 is held on both sides of the bellows 340 and can be screwed or unscrewed to modify the compression of said bellows 340, and consequently the orientation of the source 300 integral with said bellows 140. It is therefore possible to modify and adjust the direction 302 of the jet of molecules by means of the threaded rods 342.

In the example shown in FIG. 1, the source 300 is oriented in a direction 302 that rises towards the sample 108, with respect to the horizontal direction. Thus, it is possible to use a liquid material load 316, while preventing said material load 316 from flowing out of the crucible of the cell 310.

The bellows 340 and the rods 342 can form part of the source 300 or be provided on the microscope.

In the example described in FIG. 3, the ballistic material jet source 300 comprises a single jet of ballistic material generator, namely the effusion cell 310.

Of course, the ballistic material jet source is not limited to a single generator and can comprise several ballistic material jet generators.

Figure 4:
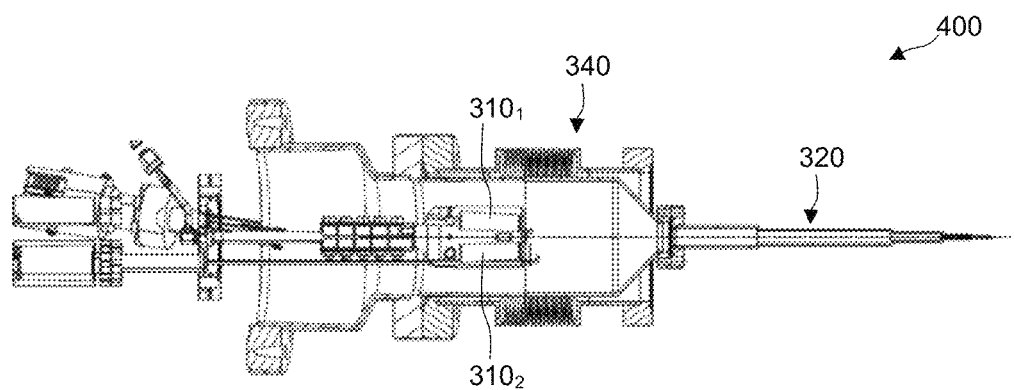
FIG. 4 is a partial diagrammatic representation, in an exploded view, of a second embodiment example of a ballistic material jet source that can be utilized in a microscope according to the invention.

FIG. 4 is a diagrammatic representation, in a cross-section view, of another example of a ballistic material jet source that can be utilized in a microscope according to the invention.

The source 400, shown in FIG. 4, can be any one of the sources 110, 202 or 204 in FIGS. 1 and 2.

The source 400 comprises, unlike the source 300 in FIG. 3, two ballistic material jet generators, namely the generators $310_1$ and $310_2$.

The generators $310_1$-$310_2$ can be identical or different.

The generators $310_1$-$310_2$ can generate ballistic jets of one and the same material or of different materials.

For example, each generator $310_1$-$310_2$ can be a molecule jet generator or a radical jet generator or also a plasma generator.

In particular, each generator $310_1$ and $310_2$ can be identical to the effusion cell 310.

The source 400 can comprise the same components as the source 300 in FIG. 3, or components carrying out the same functions as those of the components of the source 300.

At least one of these components can be individual to at least one, in particular each, generator $310_1$ and $310_2$. For example, the source 400 can comprise an individual heat shield for at least one, in particular each, generator $310_1$ and $310_2$.

Alternatively or in addition, at least one of these components can be common to both generators $310_1$ and $310_2$. For example, the source 400 can comprise the jet collimator 320 or the bellows 340 common to both generators $310_1$ and $310_2$.

In the examples described with reference to FIGS. 3 and 4, the direction of the ballistic material jets is adjusted by adjusting the orientation of all of the source, by means of a bellows, arranged between said source and the microscope.

Of course, it is possible to adjust the direction of the ballistic material jets by adjusting the orientation of only part of the source, the rest of the source remaining fixed. For example, it is possible to adjust the direction of the ballistic material jet by only adjusting the orientation of the collimator of the source.

Figure 5:
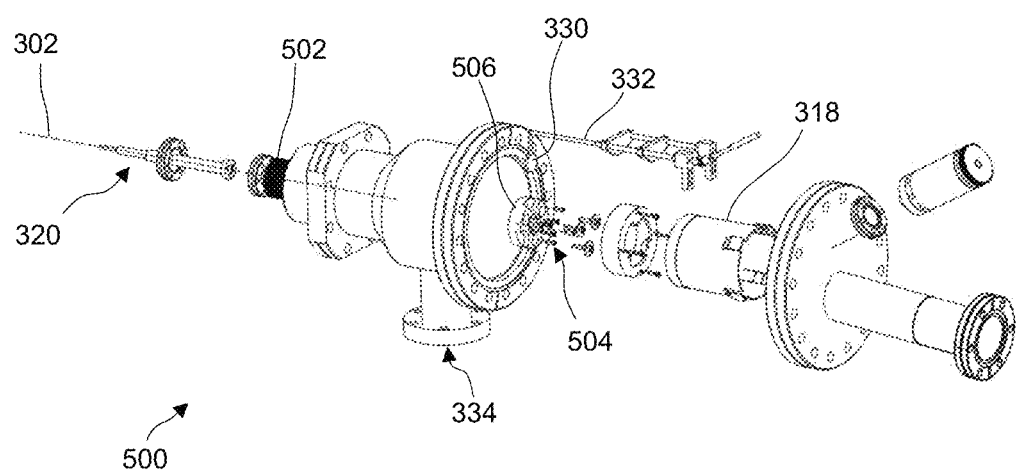
FIG. 5 is a partial diagrammatic representation, in a cross-section view, of another embodiment example of a ballistic material jet source that can be utilized in a microscope according to the invention.

FIG. 5 is a diagrammatic representation, in an exploded view, of another example of a ballistic material jet source that can be utilized in a microscope according to the invention.

The source 500, shown in FIG. 5, can be any one of the sources 110, 202 or 204 in FIGS. 1 and 2.

In the source 500, the direction of the material jet is adjusted by adjusting only the orientation of the collimator 320.

To this end, the source 500 comprises a sealed bellows 502, arranged in said source 500.

The collimator 320 is mounted integrally with the source 500, in a sealed manner, via an adjustable bellows 502. In particular, the bellows 502 is arranged around the collimator 320, like a ring, so that the collimator passes through the bellows 502. On the other hand, the bellows 502 is integral with a fixed part, or surface, of the source 500. Thus, the collimator 320 is mobile in the bellows 502 so that its orientation can be modified.

The source 500 also comprises screws 504 coming into contact on the one hand with the collimator 320, mobile in the bellows 502, and on the other hand with a support part 506 integral with a fixed part, or surface, of the source 500.

Thus, by screwing or unscrewing the fixing screw or screws, it is possible to modify the orientation of the collimator 320, and therefore the ballistic material jet in the object chamber.

Of course, the source 500 can comprise one or more ballistic jet generators, like the source 400 in FIG. 4.

According to the variant under consideration of those which have just been described:

different variants and/or combinations of generator(s) can be used according to the invention; in particular, a generator such as:
a plasma source,
a radical generator using thermal cracking,
an electron bombardment evaporator,
makes it possible to generate a ballistic material jet, for example by extracting particles of interest and isolating these particles of interest from other particles that can interfere with the trajectory of these particles of interest (for example by utilizing a differential pressure between the high-pressure generator and the low-pressure collimator), and/or
the microscope according to the invention can comprise means for maintaining the collimator at a temperature that is low enough that the particles from the material jet emitted upstream and in the direction of the walls of the collimator are trapped there, this low temperature preferably being lower than 25° C.
the pressure inside each ballistic material jet source (preferably at the level of its collimator) and/or inside the object chamber and/or between each ballistic material jet source and the object chamber is preferably lower than $10^{-2}$ Pa, even more preferably lower than $10^{-5}$ Pa.

Of course, the invention is not limited to the examples that have just been described, and numerous modifications may be made to these examples without exceeding the scope of the invention.

The invention claimed is:

1. A transmission electron microscope, comprising:
a column delimiting an object chamber;
at least one ballistic material jet source:
outside said object chamber;
fixed in a sealed manner to said column, facing an opening, called a port, provided on said column; and
at least one jet source is arranged outside the column and comprises a collimator of the material jet towards a predetermined direction, said collimator passing through the port and leading into the object chamber so that a portion of the material jet exits said source in said object chamber.

2. The microscope according to claim 1, characterized in that the collimator is arranged to trap particles of the material jet which are not emitted in the predetermined direction and to prevent these particles that were not emitted in the predetermined direction from passing into the object chamber.

3. The microscope according to claim 1, characterized in that at least one source comprises any combination of one or more material jet generators selected from:
an effusion cell,
a plasma source,
a radical generator using thermal cracking, and
an electron bombardment evaporator.

4. The microscope according to claim 3, characterized in that at least one source comprises at least one material jet generator that can be removed through an opening provided on said source.

5. The microscope according claim 1, characterized in that the collimator has a cross section which decreases in the direction of the material jet.

6. The microscope according to claim 1, characterized in that at least one source comprises at least one shutter for interrupting the material jet towards the object chamber.

7. The microscope according to claim 1, characterized in that at least one source comprises at least one heat shield arranged around a material jet generator.

8. The microscope according claim 1, characterized in that at least one source comprises a pump opening for connection thereto of a pump device adjusting, and in particular lowering, the pressure inside said source.

9. The microscope according to claim 1, characterized in that it comprises, for at least one source, an adjustment means, called aiming adjustment means, for adjusting the direction of the material jet, in at least one spatial direction.

10. The microscope according to claim 9, characterized in that, for at least one source, the aiming adjustment means comprises:
- a bellows arranged between said source and the column of said microscope; and
- at least one means for modifying the compression of said bellows following at least one point, in particular in the form of a screw.

11. The microscope according to claim 10, characterized in that, for at least one source, the aiming adjustment means comprises at least one means for modifying the position of the material jet collimator within said source.

12. The microscope according to claim 1, characterized in that, for at least one source the inside of said source communicates with the object chamber only though the material jet collimator.

13. The microscope according to claim 1, characterized in that at least one source comprises:
- a ballistic material jet generator, such as an effusion cell;
- two concentric heat shields around said generator;
- a material jet collimator downstream of said generator;
- a shutter between said generator and said collimator; and
- a means for adjusting the aiming direction.

14. The microscope according to claim 1, characterized in that it comprises means for maintaining the collimator at a temperature that is low enough that the particles from the material jet emitted upstream and in the direction of the walls of the collimator are trapped there, this low enough temperature preferably being lower than 25° C.

* * * * *